US011291106B2

(12) United States Patent
Wang et al.

(10) Patent No.: US 11,291,106 B2
(45) Date of Patent: Mar. 29, 2022

(54) SYSTEM AND METHOD FOR ENHANCED COOLING

(71) Applicant: Dell Products L.P., Hopkinton, MA (US)

(72) Inventors: Isaac Q. Wang, Austin, TX (US); Jordan H. Chin, Austin, TX (US); James L. Petivan, Austin, TX (US); Robert Boyd Curtis, Georgetown, TX (US); Tim M. Spencer, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/776,061

(22) Filed: Jan. 29, 2020

(65) Prior Publication Data

US 2021/0235575 A1 Jul. 29, 2021

(51) Int. Cl.
*H05K 1/02* (2006.01)
*H05K 1/18* (2006.01)

(52) U.S. Cl.
CPC .......... *H05K 1/0207* (2013.01); *H05K 1/181* (2013.01); *H05K 2201/066* (2013.01); *H05K 2201/2036* (2013.01)

(58) Field of Classification Search
CPC .......... H01L 2924/181; H01L 2224/97; H01L 23/367; H01L 2225/06589; H01L 23/3121; H01L 23/36; H01L 23/42; H01L 23/34; H01L 23/373; H01L 21/4882; H01L 21/4871; H01L 21/823475; H01L 2023/405; H01L 2023/4062; H01L 2023/4068; H05K 1/0209; H05K 1/115; H05K 1/185; H05K 2201/066; H05K 1/0204; H05K 1/0206; H05K 1/186; H05K 2201/10545; H05K 2203/1469; H05K 7/205; H05K 7/209

See application file for complete search history.

(56) References Cited

U.S. PATENT DOCUMENTS

| | | | | |
|---|---|---|---|---|
| 6,462,410 | B1 * | 10/2002 | Novotny | H01L 23/34 257/704 |
| 8,786,075 | B1 * | 7/2014 | Miks | H01L 23/3675 257/704 |
| 2003/0230799 | A1 * | 12/2003 | Yee | H01L 23/3677 257/706 |
| 2007/0187839 | A1 * | 8/2007 | Shim | H01L 23/49568 257/784 |
| 2007/0211711 | A1 * | 9/2007 | Clayton | H05K 1/189 370/360 |
| 2011/0068444 | A1 * | 3/2011 | Chi | H01L 21/6835 257/669 |
| 2011/0298110 | A1 * | 12/2011 | Pagaila | H01L 24/11 257/660 |

(Continued)

*Primary Examiner* — Michael A Matey
(74) *Attorney, Agent, or Firm* — Chamberlain, Hrdlicka, White, Williams & Aughtry (57) ABSTRACT

An electronic device includes a packaged device and a thermal dissipater. The packaged device includes a component that generates thermal energy, a package that encapsulates the component, and an interconnect that forms a portion of a high thermal conduction between the component and a circuit card. The thermal dissipater obtains the thermal energy using the circuit card and radiates the thermal energy.

18 Claims, 8 Drawing Sheets

(56) References Cited

U.S. PATENT DOCUMENTS

| | | | |
|---|---|---|---|
| 2013/0087904 A1* | 4/2013 | Clark | H01L 23/36 |
| | | | 257/706 |
| 2014/0225246 A1* | 8/2014 | Henderson | H01L 23/36 |
| | | | 257/691 |
| 2014/0252645 A1* | 9/2014 | Kim | H01L 23/3677 |
| | | | 257/774 |
| 2015/0126134 A1* | 5/2015 | Lobianco | H04B 1/38 |
| | | | 455/73 |
| 2017/0062383 A1* | 3/2017 | Yee | H01L 24/03 |
| 2018/0151466 A1* | 5/2018 | Hsu | H01L 23/49822 |
| 2018/0190617 A1* | 7/2018 | Chew | H01L 23/481 |
| 2018/0247915 A1* | 8/2018 | Kinsley | H01L 23/36 |
| 2018/0350712 A1* | 12/2018 | Thanu | H01L 23/3675 |
| 2019/0004571 A1* | 1/2019 | Sahu | H01L 23/147 |
| 2019/0215948 A1* | 7/2019 | Arnitz | H05K 1/0216 |
| 2019/0323785 A1* | 10/2019 | Eid | H01L 23/3677 |
| 2020/0161229 A1* | 5/2020 | Gandhi | H01L 21/4864 |
| 2020/0260609 A1* | 8/2020 | Saha | H05K 1/0209 |
| 2020/0294886 A1* | 9/2020 | Saha | H01L 24/09 |

* cited by examiner

SYSTEM AND METHOD FOR ENHANCED COOLING

BACKGROUND

Computing devices may perform services. To provide the services, the computing devices may include hardware components and software components. The software components may utilize the hardware components to provide the services.

SUMMARY

In one aspect, an electronic device in accordance with one or more embodiments of the invention includes a packaged device and a thermal dissipater. The packaged devices includes a component that generates thermal energy, a package that encapsulates the component, and an interconnect that forms a portion of a high thermal conduction between the component and a circuit card. The thermal dissipater obtains the thermal energy using the circuit card and radiates the thermal energy.

In one aspect, a thermal dissipater for dissipating thermal energy generated by a packaged device in accordance with one or more embodiments of the invention includes a body and standoffs. The standoffs obtain the thermal energy by a thermal conduction path between the standoffs and the packaged device. The thermal conduction path does not include a package of the packaged device that encapsulates a component of the packaged device that generates the thermal energy.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 2.1 shows a first diagram of a thermal dissipater in accordance with one or more embodiments of the invention.

FIG. 2.2 shows a second diagram of the thermal dissipater in accordance with one or more embodiments of the invention.

FIG. 2.3 shows a third diagram of the thermal dissipater in accordance with one or more embodiments of the invention.

FIG. 2.4 shows a fourth diagram of the thermal dissipater in accordance with one or more embodiments of the invention.

FIG. 2.5 shows a fifth diagram of the thermal dissipater in accordance with one or more embodiments of the invention.

FIG. 2.6 shows a sixth diagram of the thermal dissipater in accordance with one or more embodiments of the invention.

DETAILED DESCRIPTION

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items and does not require that the element include the same number of elements as any other item labeled as A to N. For example, a data structure may include a first element labeled as A and a second element labeled as N. This labeling convention means that the data structure may include any number of the elements. A second data structure, also labeled as A to N, may also include any number of elements. The number of elements of the first data structure and the number of elements of the second data structure may be the same or different.

In general, embodiments of the invention relate to systems, devices, and methods for managing computing devices. Managing a computing device may include managing the thermal states (e.g., temperatures) of components of the computing device.

To manage the thermal state of a component of the computing device, a thermal dissipater may be used. A thermal dissipater may be a physical device that obtains thermal energy from a packaged device and dissipates the obtained thermal energy into an ambient environment. By doing so, the thermal state of the packaged device may be managed. A computing device in accordance with embodiments of the invention may include any number and type of thermal dissipaters.

In one or more embodiments of the invention, the thermal dissipater obtains thermal energy from the packaged device via a high thermal conduction path. The high thermal conduction path may include a circuit card that interconnects the packaged device and the thermal dissipater. The high thermal conduction path may not include a package of the packaged device that encapsulates a component of the packaged device that generates the thermal energy.

In one or more embodiments of the invention, the thermal dissipater obtains thermal energy from the packaged device via a low thermal conduction path. The low thermal conduction path may include the package of the packaged device that encapsulates the component of the packaged device that generates the thermal energy. The low thermal conduction path may have a higher thermal resistance than the thermal resistance of the high thermal conduction path.

By obtaining thermal energy using the high thermal conduction path, the thermal dissipater in accordance with embodiments of the invention may have an improved ability for dissipating thermal energy generated by the packaged device when compared to other types of devices that may attempt to dissipate thermal energy obtained from the packaged device using only the low thermal conduction path.

Figure 1:
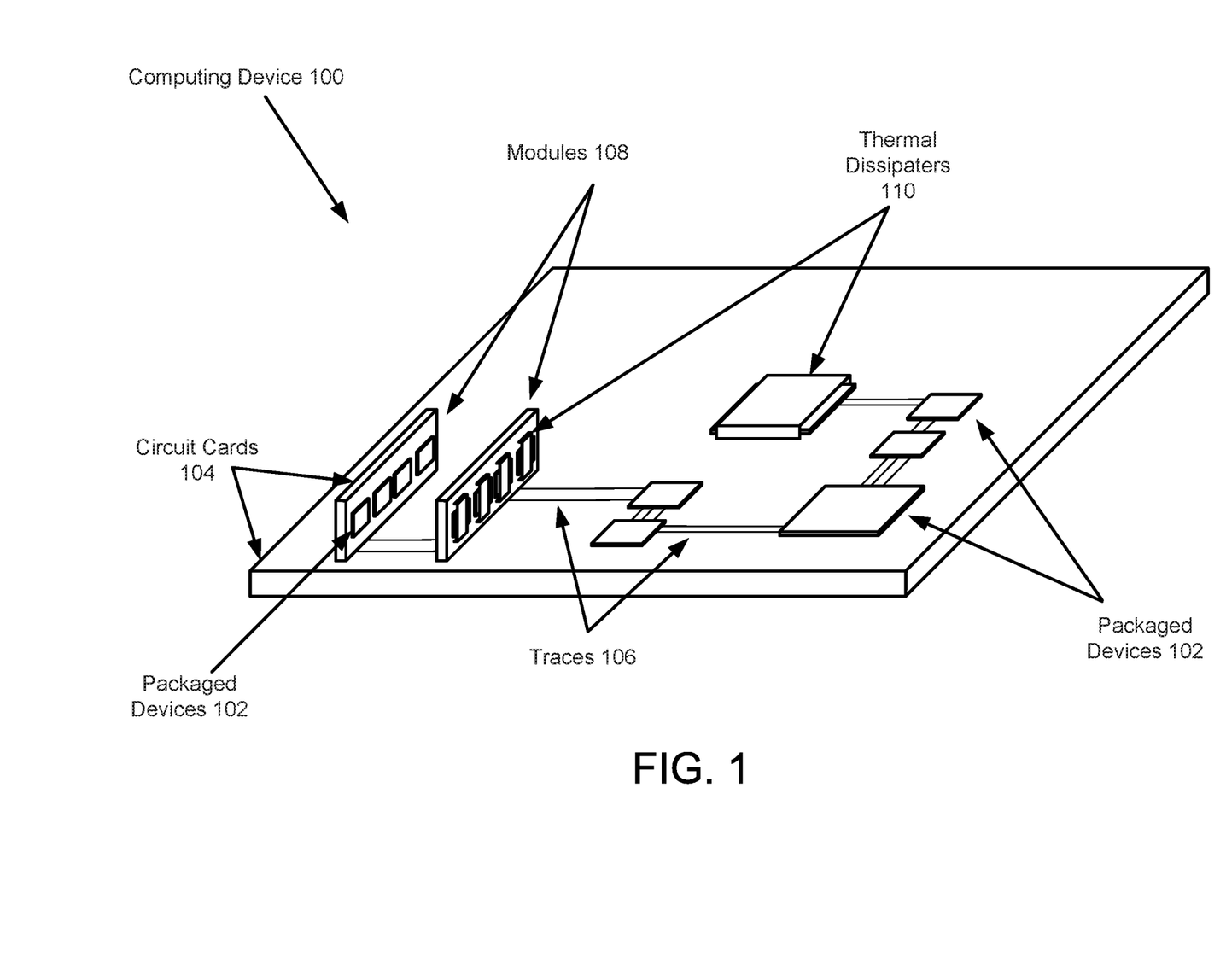
FIG. 1 shows a diagram of a system in accordance with one or more embodiments of the invention.

FIG. 1 shows a system in accordance with one or more embodiments of the invention. The system may provide computer implemented services. The computer implemented services may include, for example, database services, data storage services, electronic communications services, and/or other types of services that may be implemented using computing devices.

The system may include a computing device (100). The computing device (100) may provide all, or a portion, of the computer implemented services.

To provide computer implemented services, the computing device (100) may include packaged devices (102) operably connected to each other via one or more circuit cards. The packaged devices (102) may be electronic devices such as, for example, processors, programmable gate arrays, application specific integrated circuits (ASICs), etc. The electronic devices may be other types of electric devices (e.g., devices other than digital logic devices including, for example, power electronics devices, analog devices, electromechanical devices, etc.) without departing from the invention. For additional details regarding packaged devices, refer to FIGS. 2.1-2.6.

The circuit cards (104) may be devices that provide interconnection services to the packaged devices (102) and/or other types of devices. The circuit cards (104) may provide additional and/or different types of services without departing from the invention.

The circuit cards (104) may be, for example, printed circuit boards (PCBs). The circuit cards (104) may be planar structures that include any number of layers. The layers may include, for example, metallization layers and dielectric layers. The metallization layers may be patterned in two dimension to form traces (106) to facilitate selective transmission of electric signals along the length and width of the circuit cards (104). The dielectric layers may electrically isolate the metallization layers from each other.

The circuit cards (104) may also include vias. Vias may be conductive structures that traverse the dielectric layers to facilitate transmission of electric signals between the signal layers and/or the packaged devices (102). The vias in combination with the metallization layers may facilitate the selective transmission of electronic signals between the packaged devices (102) and/or other devices.

While the circuit cards (104) have been described as being implemented as PCBs, the circuit cards may be implemented using other interconnection technologies such as, for example, metallized polymer films, metallized wafers, and/or other types of structures that facilitate selective transmission of electronic signals between devices.

The computing device (100) may also include modules (108). A module may be an aggregation of packaged devices disposed on a circuit card that is electrically and/or physically connected to a second circuit card. For example, memory used in computing devices may be implemented as modules.

The packaged devices (102) of the computing device (100) may perform their operation using electric power. To provide power to the packaged devices (102), portions of the circuit cards (104) may be adapted to apply a voltage potential to the packaged devices (102). For example, the circuit cards (104) may include traces that are used as power and ground lines, respectively. When in operation, an electric potential may be generated between the power and ground lines thereby driving electric power to the packaged devices (102).

When in operation, the packaged devices (102) may generate thermal energy. The thermal energy generated by the packaged devices (102) may cause the temperatures of the packaged devices (102) to rise, depending on the respective quantities of thermal energy that each of the packaged devices (102) generate and the rate that the thermal energy is naturally dissipated into an ambient environment.

Each of the packaged devices (102) may have a preferred operating temperature range. If the temperatures of the packaged devices (102) exceeds the respective preferred operating temperature range, the (i) service life of the packaged devices (102) may decrease, (ii) the operation of the packaged devices (102) may be non-ideal (may not operate correctly), and/or (iii) the packaged devices (102) may fail.

Embodiments of the invention may provide a method and system for improving the likelihood that packaged devices (102) are maintained in a preferred operating temperature range while in operation. To do so, embodiments of the invention may provide thermal dissipaters (110) that provide thermal management services for the packaged devices (102). Thermal management services may include dissipating of thermal energy generated by the packaged devices (102). By dissipating thermal energy, the thermal energy generated by the packaged devices (102) may be less likely to cause the operating temperatures of the packaged devices (102) to go outside of the respective preferred operating temperature ranges of the packaged devices (102).

To provide thermal management services, the thermal dissipaters (110) may be implemented as physical structures that are adapted to (i) obtain thermal energy from the packaged devices (102) and (ii) radiate the obtained thermal energy into an ambient environment around the computing device (100). Airflows or other features of the ambient environment surrounding the computing device (100) may facilitate further dissipation of the thermal energy radiated by the thermal dissipaters (110).

For example, the thermal dissipaters (110) may have a shape that facilitates transfer of the thermal energy from the thermal dissipaters (110) into the airflows surrounding the computing device (100). Fans or other types of active airflow control devices may be disposed in the surrounding environment that actively cause known airflows to exist in the ambient environment.

In one or more embodiments of the invention, at least one of the thermal dissipaters (110) is adapted as a low-profile device. A low-profile device may be a device that does not add significant height (e.g., less than 10%) to the profile of a packaged device for which the thermal dissipater provides. The profile of the packaged devices may be the height of the packaged devices (102) measured from the circuit card upon which the packaged devices (102) are disposed.

The thermal dissipaters (110) may be implemented as passive devices. For example, the thermal dissipaters may be implemented as thermally conductive structures that do not utilize power to provide thermal management services.

The thermal dissipaters (110) may be implemented as active devices. For example, the thermal dissipaters (110) may include any number of fans, thermoelectric chillers, or other types of devices that consume power.

For additional details regarding thermal dissipaters (110), refer to FIGS. 2.1-2.6.

While the computing device (100) of FIG. 1 is illustrated as including a limited number of specific components, a computing device in accordance with embodiments of the invention may include additional, fewer, and/or different components without departing from the invention. For an example of a computing device, refer to FIG. 3.

As discussed above, thermal dissipaters may provide thermal management services. FIGS. 2.1-2.6 show diagrams of thermal dissipaters in accordance with embodiments of the invention that may provide thermal management services.

Each of the aforementioned diagrams illustrates a side view of a thermal management device, a packaged device, and a circuit card. In the diagrams, portions of the packaged device and circuit card that would not be visible by virtue of being internal portions of the aforementioned devices are illustrated using dashed lines.

Figure 21:
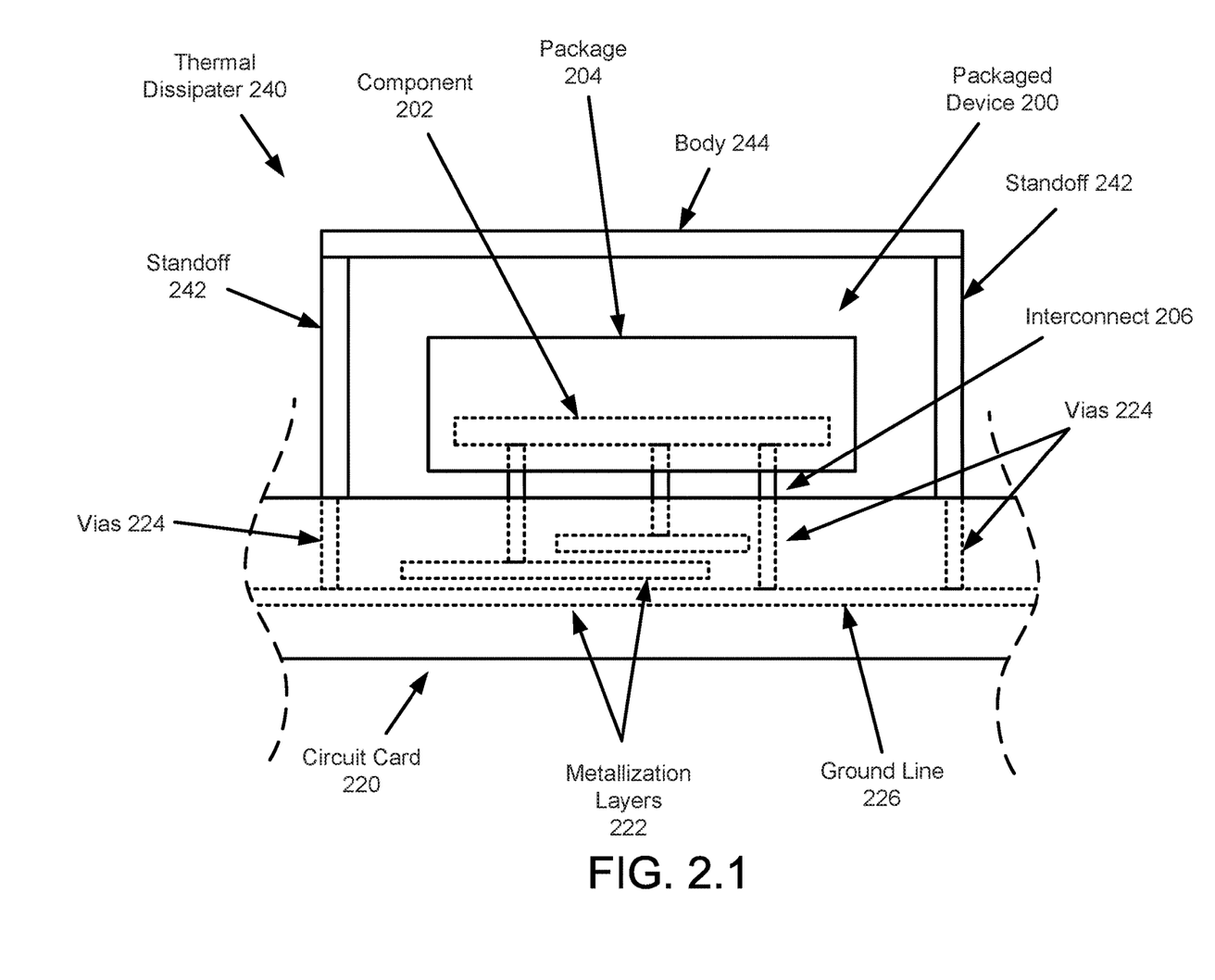

FIG. 2.1 shows a side view diagram of a packaged device (200), circuit card (220), and thermal dissipater (240) in accordance with one or more embodiments of the invention. Each of these is discussed below.

As discussed above, the packaged device (200) may operate to enable a computing device or other type of electronic device to perform some, or all, of its functionality. To do so, the packaged device (200) may include a component (202), a package (204), and an interconnect (206).

The component (202) may be an active device that utilizes power to provide a function. The function may be provided by generating, modulating, or otherwise causing electric signals to be transmitted to other devices via the interconnect (206).

When providing its function, the component (202) may consume electric power and generate thermal energy. The component (202) may obtain the electric power via the interconnect (206). For example, the interconnect (206) may apply an electric potential to the component (202) thereby driving current through the component (202) which causes thermal energy to be generated.

The component (202) may be implemented as, for example, a semiconductor die or other type of device that uses electric power to perform a function while generating thermal energy as part of performing the function.

The package (204) may be a physical structure that physically separates the component (202) from other structures. The package (204) may provide electrical and/or thermal isolation from the ambient environment surrounding the component (202). The package (204) may be implemented as, for example, a material layer that encapsulates the component (202).

The interconnect (206) may enable the component (202) to be interconnected with other structures (e.g., portions of a circuit card) via paths that are (i) highly electrically conductive and/or (ii) more thermally conductive than the package (204). The interconnect (206) may enable electrical energy to be obtained by the component (202) and/or for the component (202) to provide electrical signals to other devices (e.g., through the circuit card).

The interconnect (206) may be implemented using, for example, metal structures (e.g., wire bonding and metal legs, balls, or other structures that protrude through the packaging (204)) that enable one or more portions of the package (204) to be electrically connected to other devices via low electrical resistance paths. The low electrical resistance paths may also be low thermal resistance paths by virtue of the material used to form the interconnect (206). The interconnect (206) may be implemented using different types of structures without departing from the invention.

Additionally, as discussed above, the circuit card (220) may facilitate (i) providing of electrical power to the packaged device (200) and (ii) connecting the packaged device (200) to other devices thereby enabling electrical signals to be passed between the packaged device (200) and other devices. To do so, the circuit card (220) may include metallization layers (222) and vias (224).

The metallization layers (222) may be two-dimensionally patterned films that facilitate transmission of electrical signals and/or electric power along the length and width of the circuit card (220). By being patterned (e.g., formed into traces or other structures), the metallization layers (222) may selectively control the transmission of electrical power/signals along the length/width of the circuit card (220). The metallization layers (222) may be physically and/or electrically isolated (totally or partially) from each other by dielectric layer (e.g., sheets of dielectric material that separate the metallization layers). The metallization layers (222) may exist between the dielectric layers, as a top layer of the circuit card (e.g., as illustrated as traces disposed on top of the circuit card in FIG. 1), and/or as a bottom layer of the circuit card.

The vias (224) may be structures that electrically interconnect the metallization layers with each other and/or devices disposed on the circuit card. For example, the vias (224) may be implemented as metal posts that traverse through all, or a portion, of the thickness of the circuit card. The vias may physically connect to some or all of the metallization layers.

Figure 22:
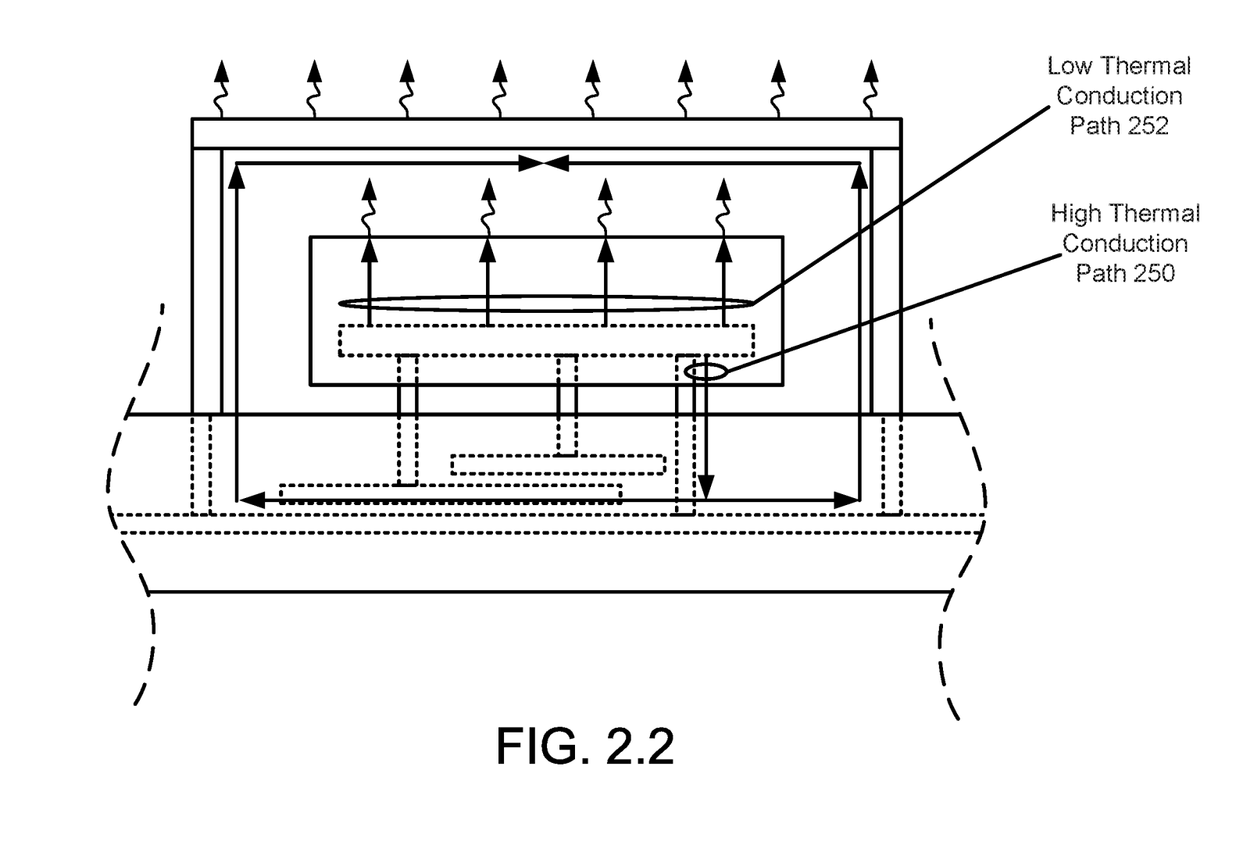

A portion of the vias and/or the metallization layers may physically connect to the interconnect (206) of the packaged device (200). By doing so, portions of the component (202) may be electrically and/or thermally connected to the circuit card. As will be discussed in greater detail with respect to FIG. 2.2, these connections may form a high thermal conduction path that enables thermal energy generated by the component (202) to be transferred to the circuit card. Embodiments of the invention may provide a thermal dissipater (240) that is adapted to use this thermal conduction path to obtain and dissipate thermal energy generated by the component.

Returning to FIG. 2.1, the thermal dissipater (240) may provide thermal management services for at least the component (202). To do so, the thermal dissipater (240) may include standoffs (242) and a body (244). The thermal dissipater (240) may include additional and/or different components as described with respect to FIGS. 2.3-2.6.

The standoffs (242) may be adapted to obtain thermal energy from the packaged device (200) by the circuit card (220). To do so, the standoffs (242) may be attachable to a portion of the circuit card (220). The portion may be, for example, vias (224) and/or one or more of the metallization layers (222). The metallization layer to which the standoffs (242) are attachable may be a ground line (226). The ground line (226) may be one or more of the metallization layers (222) used to provide electrical power to the component (202). By virtue of the physical connection to the circuit card (220), a high thermal conduction path between the component (202) and the standoffs (242) may be formed. For example, the path may include metallic structures that enable electrical signals/power to be directed and, by virtue of being metallic also enable thermal energy to be transferred between the component (202) and the standoffs (242).

The standoffs (242) may be implemented as, for example, a metal or other thermally conductive structure. The standoffs may have a height that causes the body (244), discussed below, to be separated from the circuit card (220) by a separation distance. The separation distance may be based on a thickness of the packaged device (200) which ensures that the body (244) is placed at a predetermined distance from the package (204) of the packaged device (200).

The standoffs (242) may have any shape. For example, the standoffs (242) may be implemented as (i) posts that extend from the circuit card (220) to the body, (ii) a wall (e.g., a rectangular structure extending along a length of an edge the body that separates the body (244) from the circuit card (220)), or (iii) another type of structure that (a) separates the body (244) from the package (204) by a predetermined distance and (b) facilitates transmission of thermal energy between the component and the body (244).

Figure 24:
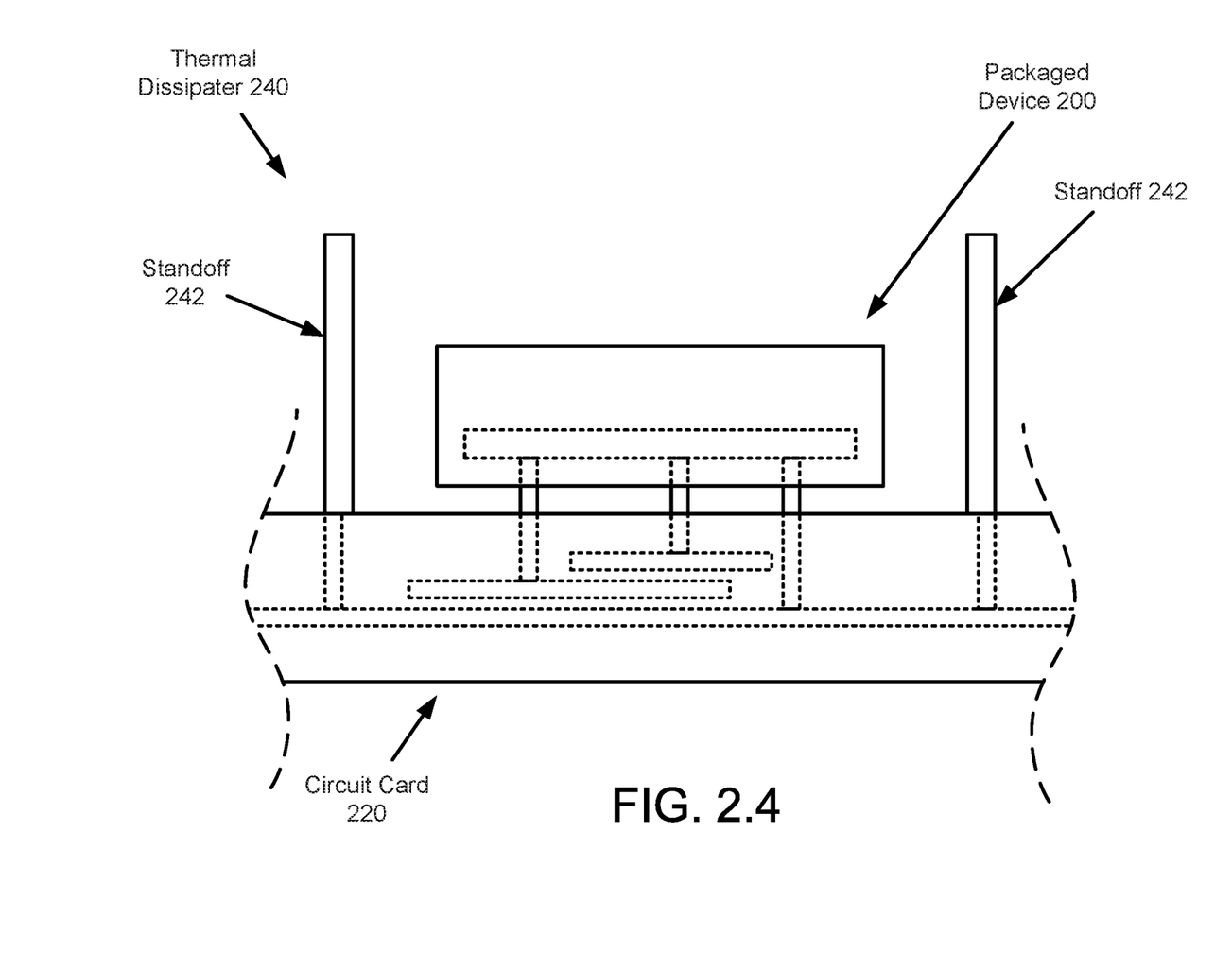

In some embodiments of the invention, the standoffs (242) may be implemented as planar sheets disposed on an exterior of the circuit card. For example, the standoffs (242) may be implemented as a metallization layer disposed on an exterior surface of the circuit card. The metallization layer may be patterned to surround the packaged device (200). The metallization layer may be connected to a ground line (226) of the circuit card (220). In such a scenario, the thermal dissipater (240) may not include a body (244). For additional details regarding such an example, refer to the discussion below with respect to FIG. 2.4.

The body (244) may be adapted to (i) obtain thermal energy from the component (202) via the circuit card (220) and the standoffs (242) and (ii) dissipate the obtained thermal energy into an ambient environment. To do so, the body (244) may be a thermally conductive structure attached to the standoffs (242).

For example, the body (244) and standoffs (242) may be implemented as a metallic structure having a cross section in the form of a C (the open side being downward facing towards the circuit card (220) in FIG. 2.1) and a predetermined length. The body and standoffs (242) may be a unitary structure or may be implemented as separate physical structures attached to each other.

The body (244) may have a shape of, for example, a sheet having a length and a width. The thickness of the body (244) may be selected to impart appropriate amount of physical rigidity to the thermal dissipater (240) and provide a sufficient thermal conduction path to enable thermal energy to be distributed across the thermal dissipater (240).

The body (244) and standoffs (242) may be formed from a thermally conductive material. The thermally conductive material may be, for example, copper, brass, aluminum, or other metals. The type of thermally conductive material may be attachable to portions of the circuit card (e.g., one or more metal portions) via, for example, soldering. The type of thermally conductive material may be attachable to the portions of the circuit card (e.g., one or more metal portions) via other methods (e.g., thermally conductive adhesives, mechanical connecting via bolts, screws, etc.) without departing from the invention.

While FIG. 2.1 has been illustrated as including a limited number of specific portion, a packaged device (200), circuit card (220), and/or thermal dissipater (240) in accordance with one or more embodiments of the invention may include additional, fewer, and/or different components without departing from the invention.

To further clarify the thermal management services provided by the thermal dissipater (240), an illustrative diagram of thermal conduction paths (250, 252) in accordance with embodiments of the invention are illustrated in FIG. 2.2. The thermal conduction paths are superimposed over the figure of FIG. 2.1 in FIG. 2.2. In FIG. 2.2, thermal conduction paths are illustrated by arrows with straight tails. Convective thermal paths that facilitate dissipation of thermal energy into an ambient environment are illustrated by arrows having wavy tails. Element numbers included in FIG. 2.1 are not included in FIG. 2.2 to simplify the figure.

As discussed above, embodiments of the invention may provide a thermal dissipater that provides thermal management services to packaged devices. To do so, the thermal dissipater may utilize a high thermal conduction path (250) to obtain thermal energy from the packaged device.

When the component of the packaged device generates thermal energy, the thermal energy may be presented with a high thermal conduction path (250) that traverses through (i) the interconnect of the packaged device, (ii) through the circuit card (e.g., through vias and/or a metallization layer such as a ground line), and (iii) into the thermal dissipater. By doing so, the thermal energy may be efficiently dissipated by the thermal dissipater as illustrated by the arrows with wavy tails above the thermal dissipater. The thermal dissipater may facilitate double sided convection of thermal energy.

For example, when the thermal energy is transported to the body, the thermal energy may be dissipated by double sided convection (e.g., both sides of the body) rather than being limited to single sided convection if the thermal energy is only dissipated through convection from an exterior surface.

The thermal energy of the component of the packaged device may also be presented with a low thermal conduction path (252). The low thermal conduction path (252) may traverse through the package of the packaged device. Due to the low thermal conductivity of the package, the thermal energy may not be efficiently dissipated by the package (e.g., out of the surface of the package) as illustrated by the arrows with wavy tails between the packaged device and the thermal dissipater being fewer in number.

Additionally, due to the low thermal conductivity of the package of the packaged device, thermal conduction of thermal energy through the package may not be improved significantly by addition of a heatsink or other structure to an exterior of the packaged device. In contrast, the thermal dissipater may greatly improve thermal energy transfer through the circuit card due to the high thermal conduction path (250) through the circuit card.

As discussed above, a thermal dissipater may include additional components than those illustrated in FIG. 2.1. Each of FIGS. 2.3-2.6 show respective diagrams of the thermal dissipater in accordance with embodiments of the invention with additional components from those illustrated in FIG. 2.1. For simplicity, only the additional components and a limited selection of components present in FIG. 2.1 are numbered in FIGS. 2.3-2.6.

Figure 23:
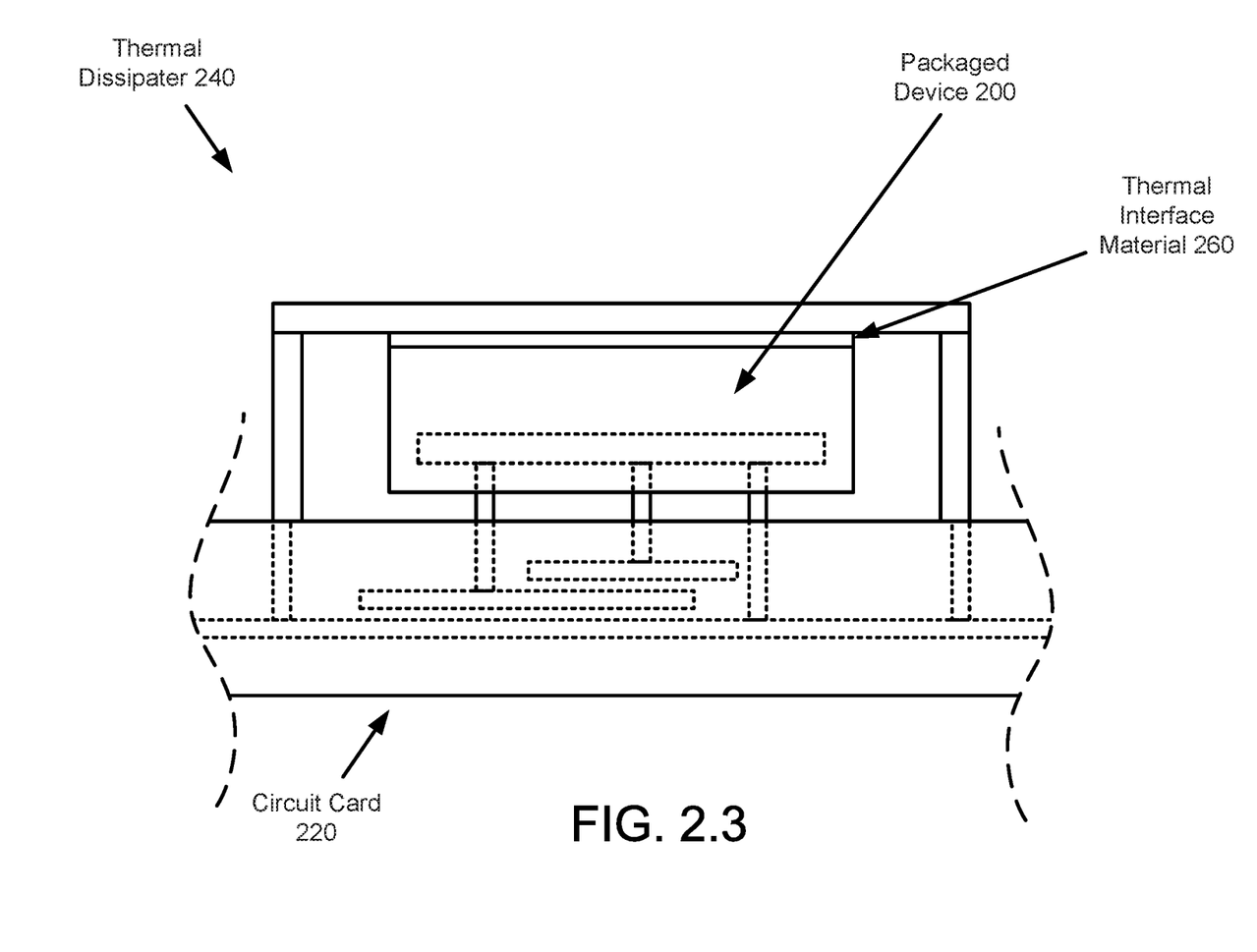

FIG. 2.3 shows a diagram of the thermal dissipater in accordance with embodiments of the invention. In FIG. 2.3, a thermal interface material (260) is disposed between the packaged device (200) and the thermal dissipater (240). For example, a layer of thermal conduction paste may be disposed between the package of packaged device (200) and the body of the thermal dissipater (240). By doing so, transmission of thermal energy along the low thermal conduction path illustrated in FIG. 2.2 may be improved thereby further enhancing dissipation of thermal energy generated by the packaged component.

The thermal past may include, for example, thermally conductive particles. The particles may form high thermal conduction paths between an exterior of the package of the packaged device (200) and the body (or other portions) of the thermal dissipater (240).

Turning to FIG. 2.4, FIG. 2.4 shows a diagram of the thermal dissipater in accordance with embodiments of the invention in which the body of the thermal dissipater is removed. In other words, the thermal dissipater (240) only includes standoffs (242). By removing the body, the profile of the thermal dissipater may be further reduced thereby enabling the thermal dissipater (240) to be used in height restricted locations such as, for example, on modules (e.g., 108, FIG. 1) that need to be placed tightly together.

In such a configuration, the standoffs (242) of the thermal dissipater (240) may include thermal energy dissipating features (not shown) such as fins or other high surface area structures adapted to transfer heat into an ambient environment. Alternatively, the standoffs (242) may be adapted to physically connect to heat pipes or other structures (e.g., thermal energy exchanges using in a liquid cooling setup) for facilitating dissipation of thermal energy.

In a still further example, the standoffs (242) may have a minimal height such that the standoffs (242) are conformal to the circuit card (220). For example, the standoffs (242) may be implemented as an outer layer of metallization attached to the circuit card (220) that is etched. In such a scenario, the standoffs (242) may have of height of less than 0.15 millimeters.

The standoffs (242) may surround all, or a portion, of the packaged device (200).

For example, when viewed from above the circuit card (220), the standoffs (242) may appear to be a layer of metallization that partially, or entirely, surrounds the packaged device (200) and/or the traces connecting to the packaged device (200).

Figure 25:
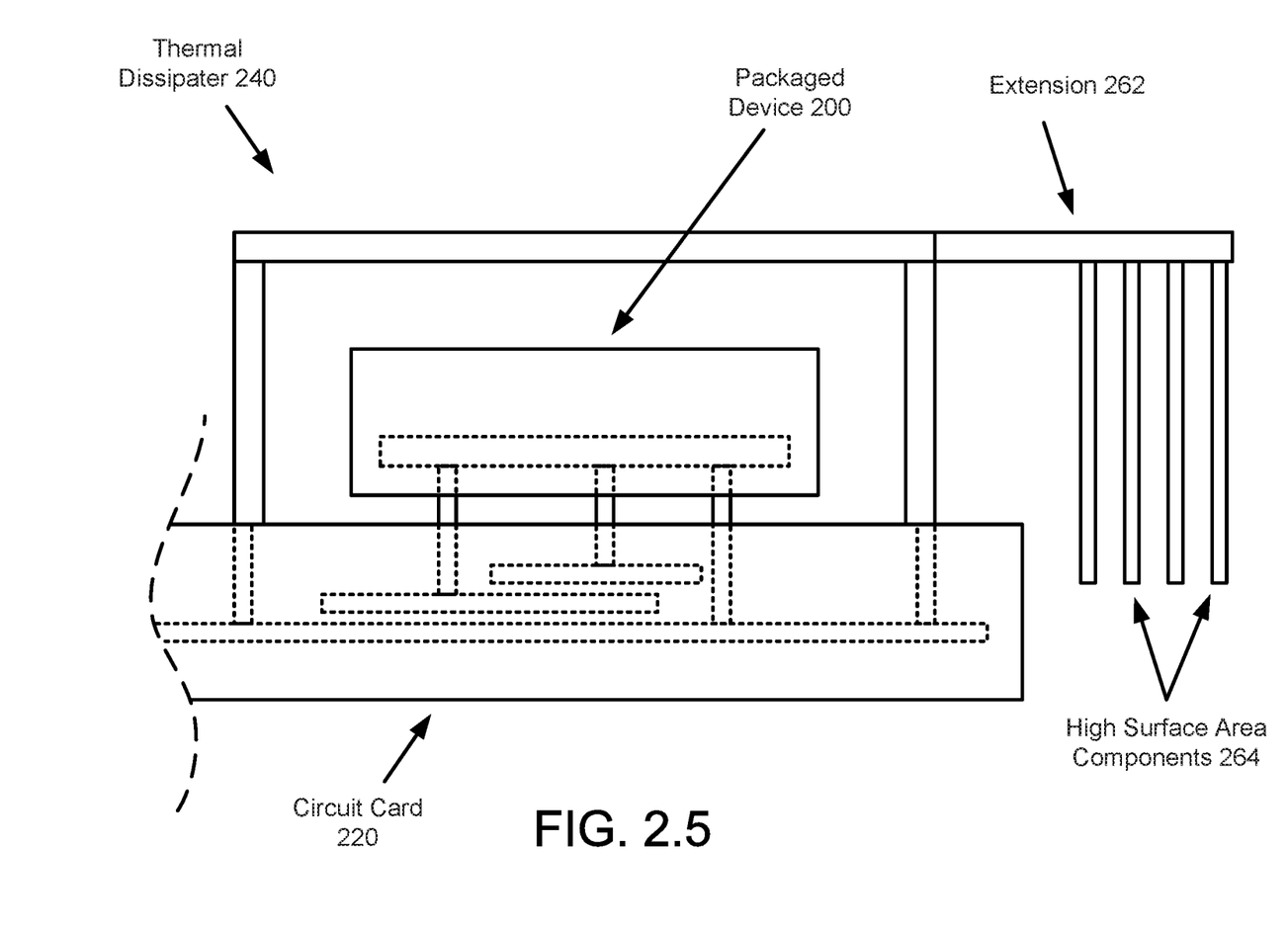

Turning to FIG. 2.5, FIG. 2.5 shows a diagram of the thermal dissipater in accordance with embodiments of the invention in which the body of the thermal dissipater includes an extension (262) and high surface area components (264). The extension (262) may be a physical structure that extends the body beyond the standoffs. For example, if used in conjunction with a module (e.g., 108, FIG. 1), the extension may extend beyond an edge of the circuit card of the module. High surface area components (264) may be disposed on a face of the extension facing towards the module.

The high surface area components (264) may be fins or other types of structures that enhance exchange of thermal energy with the ambient environment thereby improving the ability of the thermal dissipater to dissipate thermal energy obtained from the packaged device (200).

By placing the high surface area components (264) on the face of the extension that (i) faces the circuit card and (ii) is beyond an edge of the circuit card, the high surface area components (264) may be given a height without increasing the height of the thermal dissipater (240) when measured from the surface of the circuit card (220). By doing so, the thermal dissipater (240) may be able to more efficiently dissipate thermal energy while still being usable in low profile applications.

Figure 26:
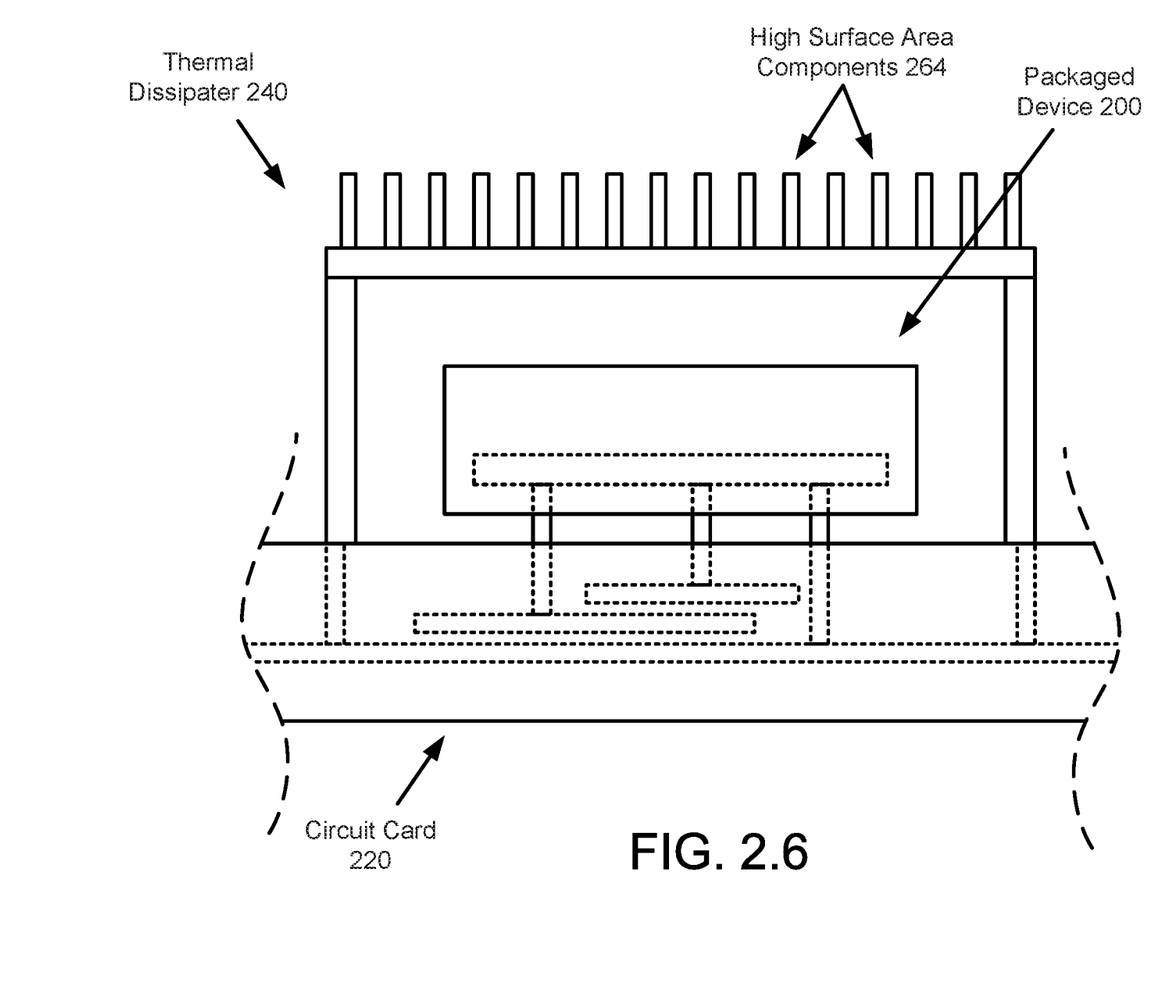

Turning to FIG. 2.6, FIG. 2.6 shows a diagram of the thermal dissipater in accordance with embodiments of the invention in which the body of the thermal dissipater includes high surface area components (264). As discussed above, the high surface area components (264) may improve the rate of thermal exchange of the thermal dissipater (240) and the ambient environment. While illustrated as being disposed on a face of the body that is opposite of the circuit card, the high surface area components (264) may be disposed on other faces of the body and/or on the standoffs of the thermal dissipater (240) without departing from the invention.

While FIGS. 2.2-2.6 have been illustrated as including a limited number of specific portion, a packaged device (200), circuit card (220), and/or thermal dissipater (240) in accordance with one or more embodiments of the invention may include additional, fewer, and/or different components without departing from the invention.

While the systems illustrated in FIG. 1-2.6 have been illustrated as including a thermal dissipater corresponding to a packaged component, a thermal dissipater in accordance with embodiments of the invention may provide thermal management services for any number of components without departing from the invention. For example, the thermal dissipater may obtain thermal energy from any number of packaged devices (and/or other types of devices) via a circuit card and dissipate the obtained thermal energy to provide thermal management services to any number of devices.

Figure 3:
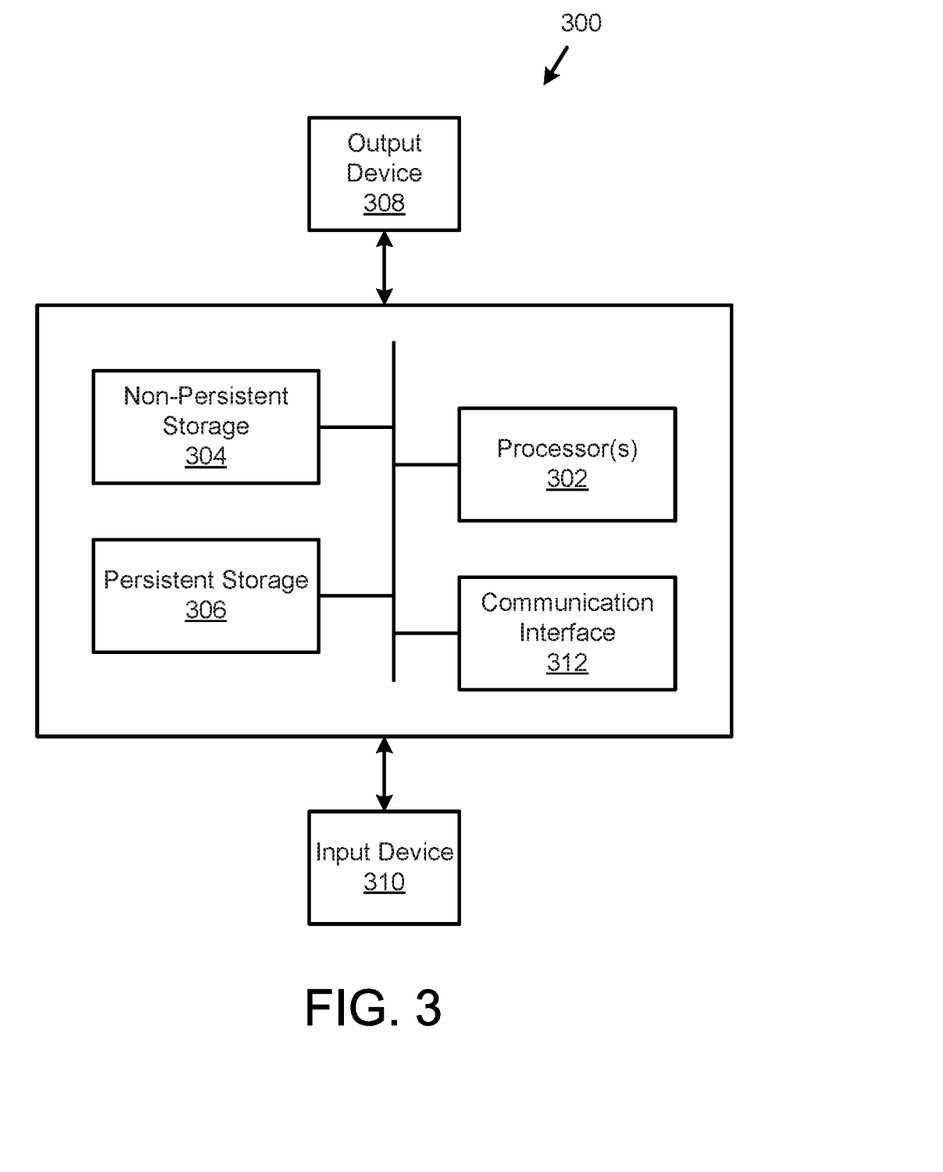
FIG. 3 shows a diagram of a computing device in accordance with one or more embodiments of the invention.

As discussed above, embodiments of the invention may be implemented using computing devices. FIG. 3 shows a diagram of a computing device in accordance with one or more embodiments of the invention. The computing device (300) may include one or more computer processors (302), non-persistent storage (304) (e.g., volatile memory, such as random access memory (RAM), cache memory), persistent storage (306) (e.g., a hard disk, an optical drive such as a compact disk (CD) drive or digital versatile disk (DVD) drive, a flash memory, etc.), a communication interface (312) (e.g., Bluetooth interface, infrared interface, network interface, optical interface, etc.), input devices (310), output devices (308), and numerous other elements (not shown) and functionalities. Each of these components is described below.

In one embodiment of the invention, the computer processor(s) (302) may be an integrated circuit for processing instructions. For example, the computer processor(s) may be one or more cores or micro-cores of a processor. The computing device (300) may also include one or more input devices (310), such as a touchscreen, keyboard, mouse, microphone, touchpad, electronic pen, or any other type of input device. Further, the communication interface (312) may include an integrated circuit for connecting the computing device (300) to a network (not shown) (e.g., a local area network (LAN), a wide area network (WAN) such as the Internet, mobile network, or any other type of network) and/or to another device, such as another computing device.

In one embodiment of the invention, the computing device (300) may include one or more output devices (308), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (302), non-persistent storage (304), and persistent storage (306). Many different types of computing devices exist, and the aforementioned input and output device(s) may take other forms.

Embodiments of the invention may provide a system for managing thermal energy generated by packaged devices. The system may include a thermal dissipater that dissipates thermal energy from a packaged device. The thermal dissipater may not be directly physically connected to the packaged device. Rather, the thermal dissipater may be thermally connected to the packaged component through a circuit card. The circuit card may be thermally connected to the packaged device via an interconnect of the packaged device. The interconnect and circuit card may form a high thermal conduction path through which thermal energy generated by the packaged device may be transferred to the thermal dissipater. By doing so, embodiments of the invention may provide a system that (i) has improved thermal dissipation, (ii) provides more reliably formed thermal pathways by avoiding thermal paths that utilize a package of a packaged device for thermal conduction, and/or (iii) requires a reduced number of thermal dissipaters for managing the temperature of components of the system.

Thus, embodiments of the invention may address the problems of thermal energy generated by a system.

The problems discussed above should be understood as being examples of problems solved by embodiments of the invention of the invention and the invention should not be limited to solving the same/similar problems. The disclosed invention is broadly applicable to address a range of problems beyond those discussed herein.

One or more embodiments of the invention may be implemented using instructions executed by one or more processors of a computing device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as of the invention. Accordingly, the scope of the invention should be limited only by the attached claims.

What is claimed is:

1. An electronic device, comprising:
   a packaged device, comprising:
      a component that generates thermal energy,
      a package that encapsulates the component, and
      an interconnect that forms a portion of a high thermal conduction path between the component and a circuit card; and
   a thermal dissipater adapted to:
      obtain the thermal energy via the high thermal conduction path using the circuit card; and
      radiate the thermal energy, wherein the thermal dissipater adds less than 10% to a height of the packaged device measured from the circuit card;
   wherein the circuit card comprises a second high thermal conduction path that connects the high thermal conduction path to the thermal dissipater, and
   wherein the high thermal conduction path comprises a continuous metal path that directly connects the packaged device to a metal portion of the thermal dissipater.

2. The electronic device of claim 1, wherein the second high thermal conduction path comprises a ground line of the circuit card.

3. The electronic device of claim 1, wherein the thermal dissipater is thermally connected to the component by a low thermal conduction path.

4. The electronic device of claim 3, wherein the low thermal conduction path comprises an air gap between a portion of the package and a portion of the thermal dissipater.

5. The electronic device of claim 3, wherein the low thermal conduction path comprises:
   the package, and
   a thermal interface material that physically connects the portion of the thermal dissipater and the package.

6. The electronic device of claim 1, wherein the thermal dissipater comprises:
   a body, and
   standoffs adapted to separate the body from the circuit card by a separation distance.

7. The electronic device of claim 6, wherein the separation distance is based on a thickness of the packaged device.

8. The electronic device of claim 6, wherein the body comprises a planar sheet.

9. The electronic device of claim 8, wherein the standoffs comprise a wall that extends along an edge of the planar sheet.

10. A thermal dissipater for dissipating thermal energy generated by a packaged device, comprising:
    a body; and
    standoffs adapted to obtain the thermal energy by a thermal conduction path between the standoffs and the packaged device,
    wherein the thermal conduction path does not include a package of the packaged device that encapsulates a component of the packaged device that generates the thermal energy,
    wherein the thermal conduction path includes a circuit card,
    wherein the thermal conduction path comprises a continuous metal path that directly connects the packaged device to the standoffs, and
    wherein the thermal dissipater adds less than 10% to a height of the packaged device measured from the circuit card.

11. The thermal dissipater of claim 10, wherein the thermal conduction path includes an interconnect between the component and the circuit card.

12. The thermal dissipater of claim 11, wherein the interconnect is an electrical interconnect.

13. The thermal dissipater of claim 10, wherein the standoffs comprise:
    a wall that runs along an edge of the body.

14. The thermal dissipater of claim 10, wherein the body is adapted to obtain the thermal energy by a second thermal conduction path.

15. The thermal dissipater of claim 14, wherein the thermal conduction path has a first thermal resistance, wherein the second thermal conduction path has a second thermal resistance, wherein the second thermal resistance is larger than the first thermal resistance.

16. The thermal dissipater of claim 14, wherein the second thermal conduction path comprises the package.

17. The thermal dissipater of claim 16, wherein the second thermal conduction path further comprises an air gap between the package and the body.

18. The thermal dissipater of claim 16, wherein the second thermal conduction path further comprises a thermal interface material that physically connects the body and the package.

* * * * *